US012787706B2

(12) United States Patent
Rybczynski et al.

(10) Patent No.: US 12,787,706 B2
(45) Date of Patent: Nov. 3, 2026

(54) ELECTROSTATIC CHUCK WITH REDUCED CHARGE INJECTION INTO DIELECTRIC LAYER

(71) Applicant: ENTEGRIS, INC., Billerica, MA (US)

(72) Inventors: Jakub Rybczynski, Arlington, MA (US); Steven Donnell, Burlington, MA (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 19/053,244

(22) Filed: Feb. 13, 2025

(65) Prior Publication Data

US 2025/0273500 A1 Aug. 28, 2025

Related U.S. Application Data

(60) Provisional application No. 63/558,059, filed on Feb. 26, 2024.

(51) Int. Cl.
*H10P 72/72* (2026.01)
*C09J 123/28* (2006.01)

(52) U.S. Cl.
CPC .......... *H10P 72/722* (2026.01); *C09J 123/28* (2013.01)

(58) Field of Classification Search
CPC .................. C09J 123/28; H10P 72/722; H10P 72/7616; H10P 72/72; H10P 72/0434; H10P 72/0442
See application file for complete search history.

(56) References Cited

U.S. PATENT DOCUMENTS 6,067,222 A 5/2000 Hausmann
6,466,426 B1 10/2002 Mok
9,692,325 B2 6/2017 Suuronen
10,395,963 B2 8/2019 Cooke
10,601,346 B2 * 3/2020 Bae ........................ H02N 13/00
10,665,493 B1 * 5/2020 Chen ..................... H10P 72/722
11,031,272 B2 * 6/2021 Chen ..................... H10P 72/722
2003/0161088 A1 8/2003 Migita
(Continued)

FOREIGN PATENT DOCUMENTS

CN 110534470 A 12/2019
CN 114899138 A 8/2022
(Continued)

*Primary Examiner* — Jue Zhang
*Assistant Examiner* — Nicolas Bellido

(57) ABSTRACT

An electrostatic chuck device having reduced charge injection may include a dielectric layer, a bonding layer, an electrode layer, and an isolator layer, the bonding layer being located between the dielectric layer and the electrode layer, the electrode layer being located between the bonding layer and the isolator layer, and the electrode layer does not directly contact the dielectric layer. The bonding layer comprises a non-electrically conductive polymeric material that covers the electrode layer such that a surface roughness of an upper surface of the bonding layer is less than a surface roughness of an upper surface of the electrode layer. The electrostatic chuck device may also include a charge barrier layer located between the bonding layer and the electrode layer to further reduce a surface roughness of the bonding layer as compared to the electrode layer. The reduced surface roughness reduces charge injection from the electrode layer.

17 Claims, 3 Drawing Sheets

(56) References Cited

U.S. PATENT DOCUMENTS

| | | | |
|---|---|---|---|
| 2007/0227027 | A1 | 10/2007 | Holzapfel |
| 2008/0049374 | A1 | 2/2008 | Morioka |
| 2008/0174930 | A1 | 7/2008 | Hattori |
| 2008/0315536 | A1 | 12/2008 | Miyazawa |
| 2009/0284893 | A1 | 11/2009 | Ando |
| 2011/0141650 | A1 | 6/2011 | Fujisawa |
| 2014/0063682 | A1 | 3/2014 | Anada |
| 2014/0204501 | A1 | 7/2014 | Moriya |
| 2014/0367570 | A1 | 12/2014 | Kimba |
| 2015/0214087 | A1* | 7/2015 | Stone ...................... C23C 16/50 427/576 |
| 2018/0123486 | A1 | 5/2018 | Bae |
| 2020/0035469 | A1 | 1/2020 | Momiyama |
| 2020/0144941 | A1 | 5/2020 | Chen |
| 2020/0227300 | A1 | 7/2020 | Lee |
| 2022/0388914 | A1 | 12/2022 | Miura |
| 2023/0136703 | A1* | 5/2023 | Liu ..................... C23C 16/4581 361/234 |

FOREIGN PATENT DOCUMENTS

| | | | |
|---|---|---|---|
| JP | H0831917 | A | 2/1996 |
| JP | 2011148687 | A | 8/2011 |
| JP | 2012119704 | A | 6/2012 |
| KR | 20160117436 | A | 10/2016 |
| TW | 201543588 | A | 11/2015 |
| TW | I550762 | B | 9/2016 |
| TW | 201804555 | A | 2/2018 |
| TW | I739642 | B | 9/2021 |
| TW | 202347405 | A | 12/2023 |
| WO | 2005083752 | A2 | 9/2005 |
| WO | 2008053934 | A1 | 5/2008 |
| WO | 2015120265 | A1 | 8/2015 |
| WO | 2016158110 | A1 | 10/2016 |

* cited by examiner

ELECTROSTATIC CHUCK WITH REDUCED CHARGE INJECTION INTO DIELECTRIC LAYER

CROSS-REFERENCE TO RELATED APPLICATION

This application claims the benefit of and priority to U.S. Provisional Application No. 63/558,059, filed on Feb. 26, 2024, which is incorporated herein by reference in its entirety for all purposes.

FIELD

The present disclosure relates to electrostatic chucks and related methods.

BACKGROUND

Electrostatic chucks are high voltage electrical devices useful in the semiconductor manufacturing processes. During use of the electrostatic chuck, the back side of a substrate, such as a semiconductor wafer, is held to the face of the electrostatic chuck by an electrostatic force such that the wafer contacts a dielectric layer of the electrostatic chuck.

SUMMARY

Some embodiments relate to an electrostatic chuck. In some embodiments, the electrostatic chuck comprises a dielectric layer. In some embodiments, the electrostatic chuck comprises a bonding layer. In some embodiments, the electrostatic chuck comprises a charge barrier layer. In some embodiments, the electrostatic chuck comprises an electrode layer. In some embodiments, the electrostatic chuck comprises an isolator layer. In some embodiments, the bonding layer is located between the dielectric layer and the charge barrier layer. In some embodiments, the charge barrier layer is located between the bonding layer and the electrode layer. In some embodiments, the electrode layer is located between the charge barrier layer and the isolator layer so that electrode layer does not directly contact the dielectric layer.

Some embodiments relate to an electrostatic chuck. In some embodiments, the electrostatic chuck comprises a dielectric layer. In some embodiments, the electrostatic chuck comprises a bonding layer. In some embodiments, the electrostatic chuck comprises an electrode layer. In some embodiments, the electrostatic chuck comprises an isolator layer. In some embodiments, the bonding layer is located between the dielectric layer and the electrode layer. In some embodiments, the electrode layer is located between the bonding layer and the isolator layer. In some embodiments, the electrode layer does not directly contact the dielectric layer.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

Figure 1:
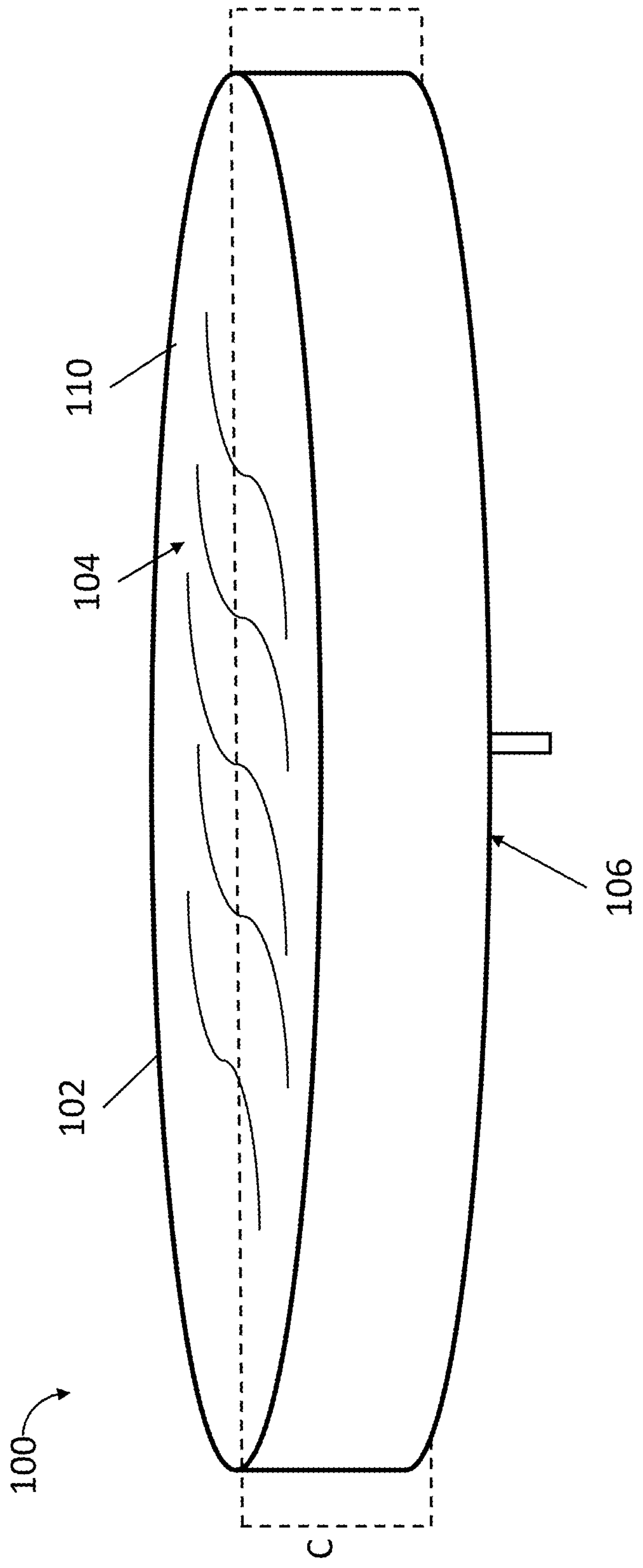
FIG. 1 is a perspective view of a non-limiting example embodiment of a device.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Conventional electrostatic chucks include a dielectric layer that separates the electrode layer from the wafer so that, during the clamping process, the wafer contacts the dielectric layer surface rather than the electrode layer. The electrical properties and thickness of the dielectric material typically determine the clamp force. The thickness of the dielectric layer is designed to allow the electrostatic chuck to operate at a reasonable voltage range. As such, the electrode layer is arranged on a bottom surface of the dielectric layer such that the electrode layer is in direct contact with the dielectric layer. The coated dielectric layer (and electrode layer) is then bonded with a supporting, electrically isolating substrate such as, for example, a ceramic layer.

Embodiments disclosed herein overcome at least the problems of conventional chucks by providing, among other things, electrostatic chucks that include one or more layers between the dielectric layer and the electrode layer to reduce a likelihood of charge injection into the dielectric layer.

Charge injection is typically related to electron emission from sharp edges or points of the electrode layer which can cause electrons (i.e., charge carriers) to diffuse into the dielectric material. This phenomenon is also sometimes referred to as carrier diffusion or charge carrier diffusion. Because electrostatic chucks are often built from mechanically processed ceramic materials, in conventional chucks that include the electrode layer deposited onto a bottom surface of the dielectric layer, the surface of the dielectric material coated with the electrode metal layer is not perfectly smooth and the surface roughness increases a likelihood of charge injection. Therefore, when electric current is applied to the electrode layer, the sharp peaks concentrate the electric field, resulting in charge injection through carrier diffusion at these locations. In the embodiments described herein, the one or more layers include desirable dielectric properties such as, for example, a certain dielectric strength. In addition, the one or more layers may include certain characteristics so that the layer material seals any surface irregularities of the electrode layer to reduce a surface roughness and to reduce the charge injection by the electrode layer. The one or more layers therefore act as a charge barrier that effectively smooths a surface roughness of the electrode layer and reduces the carrier diffusion into the dielectric layer. In some embodiments, in addition to or instead of smoothing a surface roughness of the electrode layer, the ability to reduce carrier diffusion into the dielectric layer can result from the material selected for the one or more layers that serve as a charge barrier layer. For example, the material selected for the charge barrier layer(s) can have a high work function (e.g., greater than 5 eV) which creates an energy barrier for electrons that may diffuse from the electrode layer towards the dielectric layer.

The electrostatic chucks, as disclosed herein according to the various embodiments, can provide improved resistance to charge accumulation. In some applications such as, for example, in DC chuck designs, the wafers need to be clamped for a long period of time (e.g., hours), which can lead to charge accumulation over time in the bulk of the dielectric material. While using the chuck, the voltage (and charge polarity) is constantly applied over the period of time, and the resulting charge accumulation can lead to situations in conventional electrostatic chucks where the clamped wafer cannot be easily removed off the chuck after the clamp voltage is turned off, this may commonly be referred to as "wafer sticking."

Embodiments disclosed herein relate to electrostatic chucks that include a dielectric layer, an electrode layer, an isolator layer, and one or more layers located between the dielectric layer and the electrode layer. In some embodiments, the one or more layers includes a bonding layer located between the dielectric layer and the electrode layer. In other embodiments, the one or more layers also includes a charge barrier layer located between the bonding layer and the electrode layer. The one or more layers can be disposed between the dielectric layer and the electrode layer so that the dielectric layer does not directly contact the electrode layer, and the electrode layer is located between the one or more layers and the isolator layer. According to some embodiments, the electrostatic chuck is manufactured by depositing the electrode layer onto a top of the isolator layer, the isolator layer being configured to provide structural support to the electrostatic chuck. The one or more layers may be deposited onto the electrode layer and the isolator layer, and then the dielectric layer may be provided onto the one or more layers to bond the dielectric layer to the electrostatic chuck.

Some embodiments relate to an electrostatic chuck including a dielectric layer, a bonding layer, a charge barrier layer, an electrode layer, and an isolator layer. The bonding layer is located between the dielectric layer and the charge barrier layer, the charge barrier layer is located between the bonding layer and the electrode layer, and the electrode layer is located between the charge barrier layer and the isolator layer so that electrode layer does not directly contact the dielectric layer. In some embodiments, the dielectric layer directly contacts the bonding layer. In some embodiments, the bonding layer directly contacts the charge barrier layer. In some embodiments, the charge barrier layer directly contacts the electrode layer.

In some embodiments, the electrode layer directly contacts the isolator layer. In some embodiments, the bonding layer covers the electrode layer such that a surface roughness of an upper surface of the bonding layer is less than a surface roughness of an upper surface of the electrode layer. In some embodiments, the charge barrier layer is a continuous layer of a non-electrically conductive material. In some embodiments, the charge barrier layer includes a metal oxide deposited by atomic layer deposition.

Some embodiments relate to an electrostatic chuck including a dielectric layer, a bonding layer, an electrode layer, and an isolator layer. The bonding layer is located between the dielectric layer and the electrode layer, the electrode layer is located between the bonding layer and the isolator layer, and the electrode layer does not directly contact the dielectric layer. In some embodiments, the dielectric layer directly contacts the bonding layer. In some embodiments, the bonding layer directly contacts the electrode layer. In some embodiments, the electrode layer directly contacts the isolator layer. In some embodiments, the bonding layer covers the electrode layer such that a surface roughness of an upper surface of the bonding layer is less than a surface roughness of an upper surface of the electrode layer.

According to various embodiments, an electrostatic chuck includes a dielectric layer. The dielectric layer may comprise an electrically isolating material having a dielectric constant of 4 to 8, or any range or subrange between 4 to 8. For example, in some embodiments, the dielectric layer can comprise a material having a dielectric constant ranging from 4 to 7, 4 to 6, 4 to 5, 5 to 8, 6 to 8, or 7 to 8.

According to some embodiments, the dielectric layer may be formed of a ceramic material. The ceramic material used to form the dielectric layer can include a dielectric material that has a higher dielectric resistivity compared to a dielectric resistivity of the isolator layer. For example, in some embodiments, the dielectric layer can comprise, consist of, or consist essentially of materials including, but not limited to, alumina, zirconia, aluminum-nitride, aluminum-oxy-nitride, silicon-nitride, silicon-oxide, silicon-carbide, silicon-oxy-nitride, silicon-carbo-nitride, tungsten-carbide, titanium-oxide, hafnium silicate, zirconium silicate, zirconium silicate, hafnium dioxide, strontium dioxide, scandium dioxide, zirconium dioxide, chromium oxide, yttrium oxide, iron oxide, barium oxide, barium titanate, tantalum oxide, or any combination thereof.

The dielectric layer may have a surface roughness of 0.02 μm to 0.5 μm, or any range or subrange between 0.2 μm and 0.5 μm. For example, in some embodiments, the dielectric layer can have a surface roughness ranging from 0.02 μm to 0.4 μm, 0.02μ m to 0.3 μm, 0.02μ m to 0.2 μm, 0.02 μm to 0.1 μm, 0.02μ m to 0.05 μm, 0.05 μm to 0.5 μm, 0.1 μm to 0.5 μm, 0.2 μm to 0.5 μm, 0.3 μm to 0.5 μm, or 0.4 μm to 0.5 μm. In some embodiments, the dielectric layer has a first surface and a second surface opposite the first surface. In some embodiments, the surface roughness refers to at least one of the first surface of the dielectric layer, the second surface of the dielectric layer, or any combination thereof.

Due to the one or more layers located between the electrode layer and the dielectric layer, a thickness of the dielectric layer may be controlled to allow the electrostatic chuck to operate in a desired voltage range. However, it is to be appreciated by those having ordinary skill in the art that the thickness of the dielectric layer may be negated in electrostatic chuck designs which do not require a critically defined clamp force or have a thick dielectric ceramic layer (>300 μm), as then the added thickness of the intervening layers may have a negligible effect on clamp force. In some embodiments, the dielectric layer may have a thickness ranging from 1 μm to 300 μm, or any range or subrange therebetween. For example, in some embodiments, the dielectric layer may have a thickness ranging from 1 μm to 300 μm, 25 μm to 300 μm, 50 μm to 300 μm, 75 μm to 300 μm, 100 μm to 300 μm, 125 μm to 300 μm, 150 μm to 300 μm, 175 μm to 300 μm, 200 μm to 300 μm, 225 μm to 300 μm, 250 μm to 300 μm, 275 μm to 300 μm, 1 μm to 275 μm, 25 μm to 275 μm, 50 μm to 275 μm, 75 μm to 275 μm, 100 μm to 275 μm, 125 μm to 275 μm, 150 μm to 275 μm, 175 μm to 275 μm, 200 μm to 275 μm, 225 μm to 275 μm, 250 μm to 275 μm, 1 μm to 250 μm, 25 μm to 250 μm, 50 μm to 250 μm, 75 μm to 250 μm, 100 μm to 250 μm, 125 μm to 250 μm, 150 μm to 250 μm, 175 μm to 250 μm, 200 μm to 250 μm, 225 μm to 250 μm, 1 μm to 225 μm, 25 μm to 225 μm, 50 μm to 225 μm, 75 μm to 225 μm, 100 μm to 225 μm, 125 μm to 225 μm, 150 μm to 225 μm, 175 μm to 225 μm, 200 μm to 225 μm, 1 μm to 200 μm, 25 μm to 200 μm, 50 μm to 200 μm, 75 μm to 200 μm, 100 μm to 200 μm, 125 μm to 200 μm, 150 μm to 200 μm, 175 μm to 200 μm, 1 μm to 175 μm, 25 μm to 175 μm, 50 μm to 175 μm, 75 μm to 175 μm, 100 μm to 175 μm, 125 μm to 175 μm, 150 μm to 175 μm, 1 μm to 150 μm, 25 μm to 150 μm, 50 μm to 150 μm, 75 μm to 150 μm, 100 μm to 150 μm, 125 μm to 150 μm, 1 μm to 125 μm, 25 μm to 125 μm, 50 μm to 125 μm, 75 μm to 125 μm, 100 μm to 125 μm, 1 μm to 100 μm, 25 μm to 100 μm, 50 μm to 100 μm, 75 μm to 100 μm, 100 μm to 100 μm, 1 μm to 75 μm, 25 μm to 75 μm, 50 μm to 75 μm, 1 μm to 50 μm, 25 μm to 50 μm, or 1 μm to 25 μm. For example, in some embodiments, the dielectric layer has a thickness ranging from 25 μm to 250 μm. In another example, in some embodiments, the dielectric layer has a thickness ranging from 50 μm to 200 μm.

In some embodiments, the dielectric layer has a thickness ranging from 25 μm to 500 μm, 25 μm to 475 μm, 25 μm to 450 μm, 25 μm to 425 μm, 25 μm to 400 μm, 25 μm to 375 μm, 25 μm to 350 μm, 25 μm to 325 μm, 25 μm to 300 μm, 25 μm to 275 μm, 25 μm to 250 μm, 25 μm to 225 μm, 25 μm to 200 μm, 25 μm to 175 μm, 25 μm to 150 μm, 25 μm to 125 μm, 25 μm to 100 μm, 25 μm to 75 μm, 25 μm to 50 μm, 25 μm to 500 μm, 50 μm to 500 μm, 75 μm to 500 μm, 100 μm to 500 μm, 125 μm to 500 μm, 150 μm to 500 μm, 175 μm to 500 μm, 200 μm to 500 μm, 225 μm to 500 μm, 250 μm to 500 μm, 275 μm to 500 μm, 300 μm to 500 μm, 325 μm to 500 μm, 350 μm to 500 μm, 375 μm to 500 μm, 400 μm to 500 μm, 425 μm to 500 μm, 450 μm to 500 μm, 475 μm to 500 μm, or any range or subrange between 25 μm and 500 μm.

An electrostatic chuck, as described herein, can include a bonding layer. The bonding layer separates the electrode layer from the dielectric layer to reduce the likelihood of charge injection and to smooth out a surface roughness. The bonding layer may comprise materials having desirable dielectric properties. Desirable dielectric properties include a dielectric strength greater than 30 V/μm, a volume resistivity of greater than $1\times10^{14}$ Ohms cm, and a dielectric constant greater than 2. The bonding layer may include an electrically isolating material having a dielectric constant ranging from 2 to 8, or any range or subrange between 2 and 8. For example, in some embodiments, the bonding layer comprises a material having a dielectric constant of 2 to 7, 2 to 6, 2 to 5, 2 to 4, 2 to 3, 3 to 8, 4 to 8, 5 to 8, 6 to 8, or 7 to 8.

In some embodiments, the bonding layer comprises a ceramic, a polymer, or any combination thereof. In some embodiments, the bonding layer comprises a non-electrically conductive polymeric material. In some embodiments, the bonding layer may comprise, consist of, or consist essentially of a polymeric material having a desirable dielectric strength and that melts and becomes pliable or moldable above a specific temperature to cover a surface (e.g., electrode layer, isolator layer, or both) and solidifies upon cooling to form a layer between the electrode layer and the dielectric layer. In some embodiments, the bonding layer may comprise, consist of, or consist essentially of materials including, but not limited to, silicone, siloxane, an acrylate, polyolefin, urethanes, epoxy, nylon, styrene, polysulfone, thiol, polycarbonate (PC), polyether sulfone (PES), polyether ether ketone (PEEK), polyethylene (PE), polypropylene (PP), poly vinyl chloride (PVC), polytetrafluoroethylene (PTFE), polyimide (PI), polyphenylsulfone (PPSU), polychlorotrifluoroethylene (PCTFE or PTFCE), fluorinated ethylene propylene (FEP), perfluoroalkoxy alkane (PFA), or any combinations thereof. In some embodiments, the bonding layer can include at least one of a fluorinated ethylene propylene (FEP), a perfluoroalkoxy alkane (PFA), a polytetrafluoroethylene (PTFE), or any combination thereof. For example, in one embodiment, the bonding layer can be formed of fluorinated ethylene propylene (FEP).

To operate the electrostatic chuck in a desired voltage range, the bonding layer may have a thickness ranging from 1 μm to 1000 μm, or any range or subrange therebetween. For example, in some embodiments, the dielectric layer may have a thickness ranging from 1 μm to 1000 μm, 10 μm to 1000 μm, 25 μm to 1000 μm, 50 μm to 1000 μm, 75 μm to 1000 μm, 100 μm to 1000 μm, 150 μm to 1000 μm, 200 μm to 1000 μm, 300 μm to 1000 μm, 400 μm to 1000 μm, 500 μm to 1000 μm, 700 μm to 1000 μm, 900 μm to 1000 μm, 1 μm to 900 μm, 10 μm to 900 μm, 25 μm to 900 μm, 50 μm to 900 μm, 75 μm to 900 μm, 100 μm to 900 μm, 150 μm to 900 μm, 200 μm to 900 μm, 300 μm to 900 μm, 400 μm to 900 μm, 500 μm to 900 μm, 700 μm to 900 μm, 1 μm to 800 μm, 10 μm to 800 μm, 25 μm to 800 μm, 50 μm to 800 μm, 75 μm to 800 μm, 100 μm to 800 μm, 150 μm to 800 μm, 200 μm to 800 μm, 300 μm to 800 μm, 400 μm to 800 μm, 500 μm to 800 μm, 700 μm to 800 μm, 1 μm to 700 μm, 10 μm to 700 μm, 25 μm to 700 μm, 50 μm to 700 μm, 75 μm to 700 μm, 100 μm to 700 μm, 150 μm to 700 μm, 200 μm to 700 μm, 300 μm to 700 μm, 400 μm to 700 μm, 500 μm to 700 μm, 600 μm to 700 μm, 1 μm to 500 μm, 10 μm to 500 μm, 25 μm to 500 μm, 50 μm to 500 μm, 75 μm to 500 μm, 100 μm to 500 μm, 150 μm to 500 μm, 200 μm to 500 μm, 300 μm to 500 μm, 400 μm to 500 μm, 1 μm to 400 μm, 10 μm to 400 μm, 25 μm to 400 μm, 50 μm to 400 μm, 75 μm to 400 μm, 100 μm to 400 μm, 150 μm to 400 μm, 200 μm to 400 μm, 300 μm to 400 μm, 1 μm to 300 μm, 10 μm to 300 μm, 25 μm to 300 μm, 50 μm to 300 μm, 75 μm to 300 μm, 100 μm to 300 μm, 150 μm to 300 μm, 200 μm to 300 μm, 1 μm to 200 μm, 10 μm to 200 μm, 25 μm to 200 μm, 50 μm to 200 μm, 75 μm to 200 μm, 100 μm to 200 μm, 150

μm to 200 μm, 1 μm to 100 μm, 10 μm to 100 μm, 25 μm to 100 μm, 50 μm to 100 μm, 75 μm to 100 μm, 1 μm to 50 μm, 10 μm to 50 μm, 25 μm to 50 μm, 1 μm to 50 μm, 10 μm to 50 μm, 20 μm to 50 μm, 30 μm to 50 μm, 40 μm to 50 μm, 1 μm to 40 μm, 10 μm to 40 μm, 20 μm to 40 μm, 30 μm to 40 μm, 1μ m to 30 μm, 10 μm to 30 μm, 1 μm to 20 μm, 10 μm to 20 μm, and 1 μm to 10 μm. For example, in some embodiments, the bonding layer can have a thickness ranging from 100 μm to 300 μm.

In some embodiments, the bonding layer can have a thickness ranging from 10 μm to 200 μm, or any range or subrange between 10 μm and 200 μm. For example, in some embodiments, the bonding layer can have a thickness ranging from 10 μm to 200 μm, 10 μm to 190 μm, 10 μm to 180 μm, 10 μm to 170 μm, 10 μm to 160 μm, 10 μm to 150 μm, 10 μm to 140 μm, 10 μm to 130 μm, 10 μm to 120 μm, 10 μm to 110 μm, 10 μm to 100 μm, 10 μm to 90 μm, 10 μm to 80 μm, 10 μm to 70 μm, 10 μm to 60 μm, 10 μm to 50 μm, 10 μm to 40 μm, 10 μm to 30 μm, or 10 μm to 20 μm.

According to some embodiments, an electrostatic chuck can include a charge barrier layer. The charge barrier layer can comprise an electrically non-conductive material deposited onto the electrostatic chuck. The charge barrier layer may be free from defects such as to reduce a likelihood of charge injection from the electrode layer by smoothing out a surface roughness. Additionally, the material from which the charge barrier layer is formed can have a high work function (e.g., greater than 5 eV) such that it is a high work function material. A high work function material is a material that creates a significant energy barrier for electrons moving from the electrode layer towards to the dielectric layer.

In some embodiments, the charge barrier layer may comprise, consist of, or consist essentially of an electrically non-conductive material that can conform to a surface to which the charge barrier layer is applied and that is substantially free of surface defects to improve the surface roughness. In some embodiments, the charge barrier layer may comprise, consist of, or consist essentially of a metal oxide or a non-electrically conductive polymer. In some embodiments, the charge barrier layer may comprise, consist of, or consist essentially of materials including, but not limited to, silicon dioxide ($SiO_2$), alumina ($Al_2O_3$), aluminum-oxy-nitride (AlON), aluminum nitride (AlN), aluminum gallium nitride (AlGaN), indium aluminum nitride (InAlN), boron nitride (BN), indium aluminum gallium nitride (InAlGaN), titanium dioxide ($TiO_2$), or any combinations thereof. In some embodiments, the charge barrier layer may comprise, consist of, or consist essentially of silicon dioxide ($SiO_2$), alumina ($Al_2O_3$), aluminum-oxy-nitride (AlON), or any combinations thereof. For example, in some embodiments, the charge barrier layer may comprise alumina ($Al_2O_3$). In still other embodiments, the charge barrier layer may comprise, consist of, or consist essentially of polytetrafluoroethylene (PTFE).

In some embodiments, the charge barrier layer may be deposited onto the electrode layer with the electrode layer being disposed over and in contact with the isolator layer. The bonding layer may be applied onto the charge barrier layer during the manufacturing stage so that that dielectric layer may be bonded to the electrostatic chuck (the dielectric layer being disposed over and in contact with the bonding layer). In this regard, the charge barrier layer may help further smooth out any surface roughness associated with the electrode layer to further reduce the likelihood of charge injection. In some embodiments, the charge barrier layer may be a film. In some embodiments, the charge barrier layer may be deposited onto the electrostatic chuck as a film using a vapor phase technique.

According to some embodiments, a thickness of the charge barrier layer may also be controlled to allow the electrostatic chuck to operate in a desired voltage range. In some embodiments, the charge barrier layer may have a thickness of 10 nm to 1 μm, or any range or subrange therebetween. For example, in some embodiments, the charge barrier layer may have a thickness of 10 nm to 1 μm, 25 nm to 1 μm, 50 nm to 1 μm, 100 nm to 1 μm, 200 nm to 1 μm, 300 nm to 1 μm, 400 nm to 1 μm, 500 nm to 1 μm, 600 nm to 1 μm, 700 nm to 1 μm, 800 nm to 1 μm, 900 nm to 1 μm, 10 nm to 900 nm, 25 nm to 900 nm, 50 nm to 900 nm, 100 nm to 900 nm, 200 nm to 900 nm, 300 nm to 900 nm, 400 nm to 900 nm, 500 nm to 900 nm, 600 nm to 900 nm, 700 nm to 900 nm, 800 nm to 900 nm, 10 nm to 800 nm, 25 nm to 800 nm, 50 nm to 800 nm, 100 nm to 800 nm, 200 nm to 800 nm, 300 nm to 800 nm, 400 nm to 800 nm, 500 nm to 800 nm, 600 nm to 800 nm, 700 nm to 800 nm, 10 nm to 700 nm, 25 nm to 700 nm, 50 nm to 700 nm, 100 nm to 700 nm, 200 nm to 700 nm, 300 nm to 700 nm, 400 nm to 700 nm, 500 nm to 700 nm, 600 nm to 700 nm, 10 nm to 600 nm, 25 nm to 600 nm, 50 nm to 600 nm, 100 nm to 600 nm, 200 nm to 600 nm, 300 nm to 600 nm, 400 nm to 600 nm, 500 nm to 600 nm, 600 nm to 600 nm, 700 nm to 600 nm, 10 nm to 500 nm, 25 nm to 500 nm, 50 nm to 500 nm, 100 nm to 500 nm, 200 nm to 500 nm, 300 nm to 500 nm, 400 nm to 500 nm, 10 nm to 400 nm, 25 nm to 400 nm, 50 nm to 400 nm, 100 nm to 400 nm, 200 nm to 400 nm, 300 nm to 400 nm, 10 nm to 300 nm, 25 nm to 300 nm, 50 nm to 300 nm, 100 nm to 300 nm, 200 nm to 300 nm, 10 nm to 200 nm, 25 nm to 200 nm, 50 nm to 200 nm, 100 nm to 200 nm, 10 nm to 100 nm, 25 nm to 100 nm, 50 nm to 100 nm, 10 nm to 50 nm, 25 nm to 50 nm, or 10 nm to 25 nm. For example, in some embodiments, the charge barrier layer has a thickness of 100 nm to 300 nm.

In some embodiments, the charge barrier layer comprises an oxide coating. In some embodiments, the charge barrier layer comprises an oxide coating, wherein the oxide coating is a layer formed by a vapor deposition process, such as, for example and without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

In some embodiments, the charge barrier layer comprises a material, for example as a material of construction, having a dielectric strength of at least 5 kv/mm or greater. For example, in some embodiments, the charge barrier layer comprises a material having a dielectric strength of 5 kv/mm to 100 kv/mm, or any range or subrange between 5 kv/mm and 100 kv/mm. In some embodiments, the charge barrier layer comprises a material having a dielectric strength of 5 kv/mm to 90 kv/mm, 5 kv/mm to 80 kv/mm, 5 kv/mm to 70 kv/mm, 5 kv/mm to 60 kv/mm, 5 kv/mm to 50 kv/mm, 5 kv/mm to 40 kv/mm, 5 kv/mm to 30 kv/mm, 5 kv/mm to 20 kv/mm, 5 kv/mm to 10 kv/mm, 10 kv/mm to 100 kv/mm, 20 kv/mm to 100 kv/mm, 30 kv/mm to 100 kv/mm, 40 kv/mm to 100 kv/mm, 50 kv/mm to 100 kv/mm, 60 kv/mm to 100 kv/mm, 70 kv/mm to 100 kv/mm, 80 kv/mm to 100 kv/mm, or 90 kv/mm to 100 kv/mm.

It is to be appreciated by those having ordinary skill in the art that the thickness of each of the bonding layer and the charge barrier layer may be negated in electrostatic chuck designs which do not require a critically defined clamp force or have a thick dielectric ceramic layer (>300 μm), as then the added thickness of the bonding layer and the charge barrier layer may have a negligible effect on clamp force.

An electrostatic chuck, as disclosed herein, also includes an electrode layer. The electrode layer comprises an electrically conductive filament or wire that may be deposited onto the isolator layer. When using the electrostatic chuck, an electric current may be directed through the electrode layer to generate an electromagnetic field capable of providing a clamping force to the electrostatic chuck to allow the semiconductor wafer to be clamped onto a surface of the dielectric layer. In some embodiments, the electrode layer may comprise any of a plurality of electrically conductive metals including, but not limited to, copper, silver, gold, aluminum, zinc, nickel, platinum, lead, tungsten, other electrically conductive materials, or any combinations thereof.

The electrode layer may have a thickness ranging from 0.5 μm to 500 μm, or any range or subrange between 0.5 μm and 500 μm. For example, in some embodiments, the electrode layer has a thickness ranging from 0.5 μm to 500 μm, 0.5 μm to 475 μm, 0.5 μm to 450 μm, 0.5 μm to 425 μm, 0.5 μm to 400 μm, 0.5 μm to 375 μm, 0.5 μm to 350 μm, 0.5 μm to 325 μm, 0.5 μm to 300 μm, 0.5 μm to 275 μm, 0.5 μm to 250 μm, 0.5 μm to 225 μm, 0.5 μm to 200 μm, 0.5 μm to 175 μm, 0.5 μm to 150 μm, 0.5 μm to 125 μm, 0.5 μm to 100 μm, 0.5 μm to 175 μm, 0.5 μm to 150 μm, 0.5 μm to 125 μm, 0.5 μm to 100 μm, 0.5 μm to 75 μm, 0.5 μm to 50 μm, 0.5 μm to 25 μm, 0.5 μm to 20 μm, 0.5 μm to 15 μm, 0.5 μm to 10 μm, 0.5 μm to 5 μm, 0.5 μm to 1 μm, 25 μm to 500 μm, 50 μm to 500 μm, 75 μm to 500 μm, 100 μm to 500 μm, 125 μm to 500 μm, 150 μm to 500 μm, 175 μm to 500 μm, 200 μm to 500 μm, 225 μm to 500 μm, 250 μm to 500 μm, 275 μm to 500 μm, 300 μm to 500 μm, 325 μm to 500 μm, 350 μm to 500 μm, 375 μm to 500 μm, 400 μm to 500 μm, 425 μm to 500 μm, 450 μm to 500 μm, or 475 μm to 500 μm.

The electrode layer can include a metallic material. In some embodiments, the electrode layer comprises a material that is highly electrically conductive. In some embodiments, the electrode layer comprises a material having a resistivity of $1\times10^{-7}$ Ωm to $1\times10^{-8}$ Ωm, or any range or subrange between $1\times10^{-7}$ Ωm and $1\times10^{-8}$ Ωm.

An electrostatic chuck, as disclosed herein, can includes an isolator layer. The isolator layer may include a ceramic material. In some embodiments, the isolator layer may comprise, consist of, or consist essentially of a ceramic material. In some embodiments, for example, the insulating body may comprise, consist of, or consist essentially of a ceramic material. In some embodiments, the ceramic material may comprise, consist of, or consist essentially of, or may be selected from a group consisting of, at least one of the following: alumina, zirconia, aluminum-nitride, aluminum-oxy-nitride, silicon-nitride, silicon-oxide, silicon-carbide, silicon-oxy-nitride, silicon-carbo-nitride, tungsten-carbide, titanium-oxide, hafnium silicate, zirconium silicate, zirconium silicate, hafnium dioxide, strontium dioxide, scandium dioxide, zirconium dioxide, chromium oxide, yttrium oxide, iron oxide, barium oxide, barium titanate, tantalum oxide, or any combination thereof. In some embodiments, the insulating body may comprise an electrically conductive ceramic material, a non-conductive ceramic material, or any combination thereof. In some embodiments, for example, the insulating body may comprise silicon nitride-molybdenum disilicide. In another example, the isolator may comprise silicon nitride-molybdenum disilicide.

The isolator layer may have a surface roughness ranging from 0.02 μm to 0.5 μm, or any range or subrange between 0.2 μm and 0.5 μm. For example, in some embodiments, the isolator layer has a surface roughness ranging from 0.02 μm to 0.4 μm, 0.02μ m to 0.3 μm, 0.02 μm to 0.2 μm, 0.02μ m to 0.1 μm, 0.02 μm to 0.05 μm, 0.05 μm to 0.5 μm, 0.1 μm to 0.5 μm, 0.2 μm to 0.5 μm, 0.3 μm to 0.5 μm, or 0.4 μm to 0.5 μm. In some embodiments, the isolator layer has a first surface and a second surface opposite the first surface. In some embodiments, the surface roughness refers to at least one of the first surface of the isolator layer, the second surface of the isolator layer, or any combination thereof.

The isolator layer may have a thickness of 0.5 mm to 5 mm, or any range or subrange between 0.5 mm and 5 mm. For example, in some embodiments, the isolator layer has a thickness of 0.5 mm to 4 mm, 0.5 mm to 3 mm, 0.5 mm to 2 mm, 0.5 mm to 1 mm, 1 mm to 5 mm, 2 mm to 5 mm, 3 mm to 5 mm, or 4 mm to 5 mm.

The force required to remove a clamped substrate, when power is off, from the electrostatic chucks disclosed herein may be less than the force required to remove a clamped substrate, when power is off, from a control electrostatic chuck, wherein the control electrostatic chuck comprises a dielectric layer that directly contacts an electrode layer. In some embodiments, for example, with respect to the electrostatic chucks disclosed herein, the force is 1% to 99% less than a control electrostatic chuck, or any range or subrange between 1% and 99%. In some embodiments, the force is 1% to %, 1% to 90%, 1% to 80%, 1% to 70%, 1% to 60%, 1% to 50%, 1% to 40%, 1% to 30%, 1% to 20%, 1% to 10%, 10% to 99%, 20% to 99%, 30% to 99%, 40% to 99%, 50% to 99%, 60% to 99%, 70% to 99%, 80% to 99%, or 90% to 99%.

FIG. 1 is a perspective view of a device 100. According to various embodiments, device 100 is an electrostatic chuck. As shown in FIG. 1, the device 100 comprises a body 102 comprising a side 104 and side 106. Side 106 is opposite the body 102 from side 104. In some embodiments, the side 104 may be referred to as a top surface and side 106 may be referred to as a bottom surface.

Device 100 comprises a dielectric layer 110 on side 104. The dielectric layer 110 defines the top surface of the device 100 and the top surface of the dielectric layer 110 is configured to, during operation of device 100, contact a semiconductive wafer in response to a clamping force applied by the device 100. A cross-section C of device 100 is also shown in FIG. 1, which will be described in further detail in, at least, FIG. 2 and FIG. 3.

Figure 2:
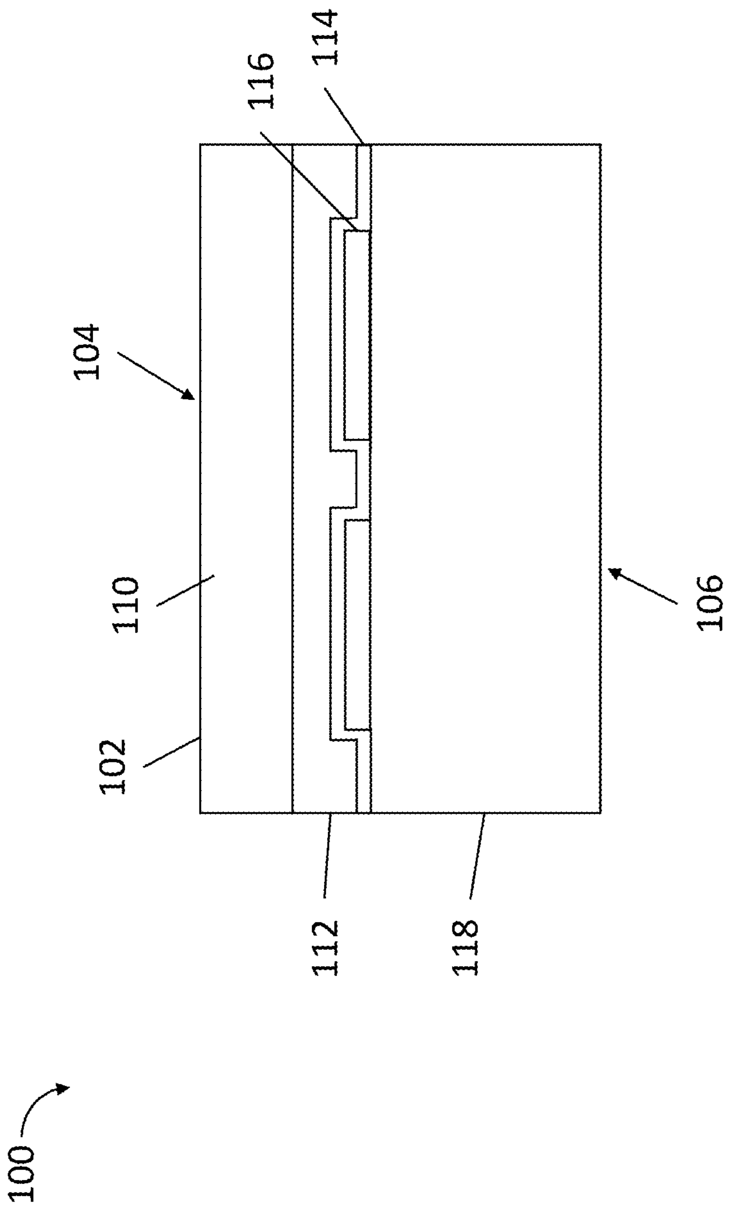
FIG. 2 is a sectional view of a non-limiting example embodiment of the device.

FIG. 2 is a cross-sectional view of a non-limiting example embodiment of the device 100. According to some embodiments device 100 is an electrostatic chuck. As shown in FIG. 2, in some embodiments, the device 100 and body 102 comprises a dielectric layer 110, a bonding layer 112, a charge barrier layer 114, an electrode layer 116, and an isolator layer 118. The bonding layer 112 is located between the dielectric layer 110, the charge barrier layer 114 is located between the bonding layer 112 and the electrode layer 116, and the electrode layer 116 is located between the charge barrier layer 114 and the isolator layer 118 so that electrode layer 116 does not directly contact the dielectric layer 110.

The dielectric layer 110 is disposed at side 104 and defines a top surface of the device 100. Opposite this top surface, the dielectric layer 110 is disposed over bonding layer 112. In some embodiments, the dielectric layer 110 is disposed over bonding layer 112 such that it directly contacts bonding layer 112. In yet some embodiments, the dielectric layer 110 can be a continuous layer of dielectric material.

The dielectric layer 110 may be formed of a suitable dielectric material such as described herein. In some embodiments, the dielectric material can be a ceramic material. The ceramic material used to form the dielectric layer 110 can include a dielectric material that has a higher dielectric resistivity compared to a dielectric resistivity of the isolator layer 118. Because the bonding layer 112 and charge barrier layer 114 are located between the electrode layer 116 and the dielectric layer 110, a thickness of each of the dielectric layer 110, bonding layer 112, and charge barrier layer 114 may be precisely controlled to allow the device 100 to operate in a desired voltage range. However, it is to be appreciated by those having ordinary skill in the art that the thickness of the dielectric layer 110 may be negated in electrostatic chuck designs which do not require a defined clamp force or have a thick dielectric ceramic layer (>300 μm), as then the added thickness of the intervening layers may have a negligible effect on clamp force.

As stated above, the thickness of the dielectric layer 110 can be controlled to allow the device 100 to operate in a desired voltage range. In some embodiments, the dielectric layer 110 may have a thickness of 1 μm to 300 μm, or any range or subrange therebetween. For example, in some embodiments, the dielectric layer 110 may have a thickness of 25 μm to 250 μm. In other embodiments, the dielectric layer 110 may have a thickness of 100 μm to 250 μm.

The bonding layer 112 is disposed between dielectric layer 110 and charge barrier layer 114. The bonding layer 112 contacts the charge barrier layer 114 and bonds the dielectric layer 110 to the charge barrier layer 114 and the other layers of device 100. In some embodiments, the bonding layer 112 directly contacts the charge barrier layer 114. As described herein, the bonding layer 112 can be a continuous layer of material to smooth a surface roughness of the electrode layer 116 to reduce the likelihood of charge injection into the dielectric layer 110. In addition, the bonding layer 112 separates the electrode layer 116 from the dielectric layer 110 to further reduce the likelihood of charge injection into the dielectric layer 110. In some embodiments, the bonding layer 112 covers the charge barrier layer 114 and the electrode layer 116 such that a surface roughness of an upper surface of the bonding layer 112 is less than a surface roughness of an upper surface of the electrode layer 116.

The bonding layer 112 may comprise materials having desirable dielectric properties. In some embodiments, the bonding layer 112 includes a non-electrically conductive polymeric material. In some embodiments, the bonding layer 112 may comprise a polymeric material having a desirable dielectric strength (e.g., dielectric strength greater than 30 V/μm) and that melts and becomes pliable or moldable above a specific temperature to cover a surface of the charge barrier layer 114 and solidifies upon cooling to form a layer between the electrode layer 116 and the dielectric layer 110. In some embodiments, the bonding layer 112 includes at least one of a fluorinated ethylene propylene, a perfluoroalkoxy alkane, a polytetrafluoroethylene, or any combination thereof.

As the bonding layer 112 is disposed between the electrode layer 116 and the dielectric layer 110 and is non-electrically conductive, a thickness of the bonding layer 112 may also be precisely controlled to allow the device 100 to operate in a desired voltage range when electric current is applied to the electrode layer 116 to generate the desired clamping force. In this regard, the bonding layer 112 may have a thickness of 1 μm to 1000 μm, or any range or subrange therebetween. For example, in some embodiments, the bonding layer 112 has a thickness of 50 μm to 200 μm.

The charge barrier layer 114 is disposed between the bonding layer 112 and electrode layer 116. The charge barrier layer 114 contacts the electrode layer 116. In some embodiments, the charge barrier layer 114 directly contacts the electrode layer 116. The charge barrier layer 114 can be a continuous layer between the bonding layer 112 and the electrode layer 116. As shown in FIG. 2, in some embodiments, the charge barrier layer 114 contacts the electrode layer 116 and isolator layer 118 through gaps in the electrode layer 116. In some embodiments, the charge barrier layer 114 directly contacts the electrode layer 116 and the isolator layer 118.

The charge barrier layer 114 comprises an electrically non-conductive material deposited onto the device 100. In some embodiments, the charge barrier layer 114 may be a film. In some embodiments, the charge barrier layer 114 may be deposited onto the device 100 as a film using a vapor phase technique. In other embodiments, the charge barrier layer 114 may be a film deposited onto the device 100 using atomic layer deposition (ALD). For example, in some embodiments, the charge barrier layer 114 comprises a metal oxide deposited as a film by ALD. According to some embodiments, the charge barrier layer 114 comprises a metal oxide. In some embodiments, the charge barrier layer 114 comprises $Al_2O_3$, $SiO_2$, AlON, $TiO_2$ other metal oxides, or any combinations thereof. For example, in some embodiments, the charge barrier layer 114 comprises $Al_2O_3$.

The charge barrier layer 114 to be utilized in device 100 may be selected for having a desired surface roughness to reduce a likelihood of charge injection from the electrode layer 116. The charge barrier layer 114 may be applied onto the electrode layer 116, and the bonding layer 112 may then be applied onto the charge barrier layer 114 during the manufacturing stage so that the bonding layer 112 may bond the dielectric layer 110 to the other layers of the body 102 of device 100. In this regard, the charge barrier layer 114 smooths out the surface roughness of the electrode layer 116 to reduce the likelihood of charge injection. In some embodiments, the charge barrier layer 114 that is to be utilized in the device 100 may be selected for being substantially free from defects (e.g., surface defects) to reduce the likelihood of charge injection from the electrode layer 116. Therefore, the charge barrier layer 114 is configured to provide an improved and smoother surface roughness than the surface roughness of the electrode layer 116. In addition, in some embodiments, the charge barrier layer 114 and the bonding layer 112 may act in combination to provide an improved and smoother surface roughness than the surface roughness of the electrode layer 116. In some embodiments, the combination of the bonding layer 112 and the charge barrier layer 114 may provide an improved and smoother surface roughness than compared to using either the charge barrier layer 114 or electrode layer 116 alone between the dielectric layer 110 and electrode layer 116.

According to some embodiments, as the charge barrier layer 114 is non-electrically conductive, a thickness of the charge barrier layer 114 can also be precisely controlled to allow the device 100 to operate in a desired voltage range. In some embodiments, the charge barrier layer 114 may have a thickness of 10 nm to 1 μm, or any range or subrange therebetween. For example, in some embodiments, the charge barrier layer 114 has a thickness of 100 nm to 1 μm.

The electrode layer 116 is disposed between the charge barrier layer 114 and isolator layer 118. The electrode layer 116 contacts the isolator layer 118. In some embodiments, the electrode layer 116 directly contacts the isolator layer 118. The electrode layer 116 comprises an electrically conductive filament or wire that may be deposited onto the isolator layer 118. When using the device 100, an electric current may be directed through the conductive filaments or wires of electrode layer 116 to generate an electromagnetic field capable of providing a sufficient clamp force to the device 100 to allow the semiconductor wafer to be clamped onto a surface of the dielectric layer 110 at side 104 during use of the device 100.

The dielectric layer 110 is bonded to the isolator layer 118 via one or more intervening layers (e.g. layers 112, 114, 116) to provide the dielectric layer 110 with structural support. The isolator layer 118 can comprise a ceramic material. The ceramic material used to form the isolator layer 118 can include material that has a lower dielectric resistivity compared to a dielectric resistivity of the dielectric layer 110.

Figure 3:
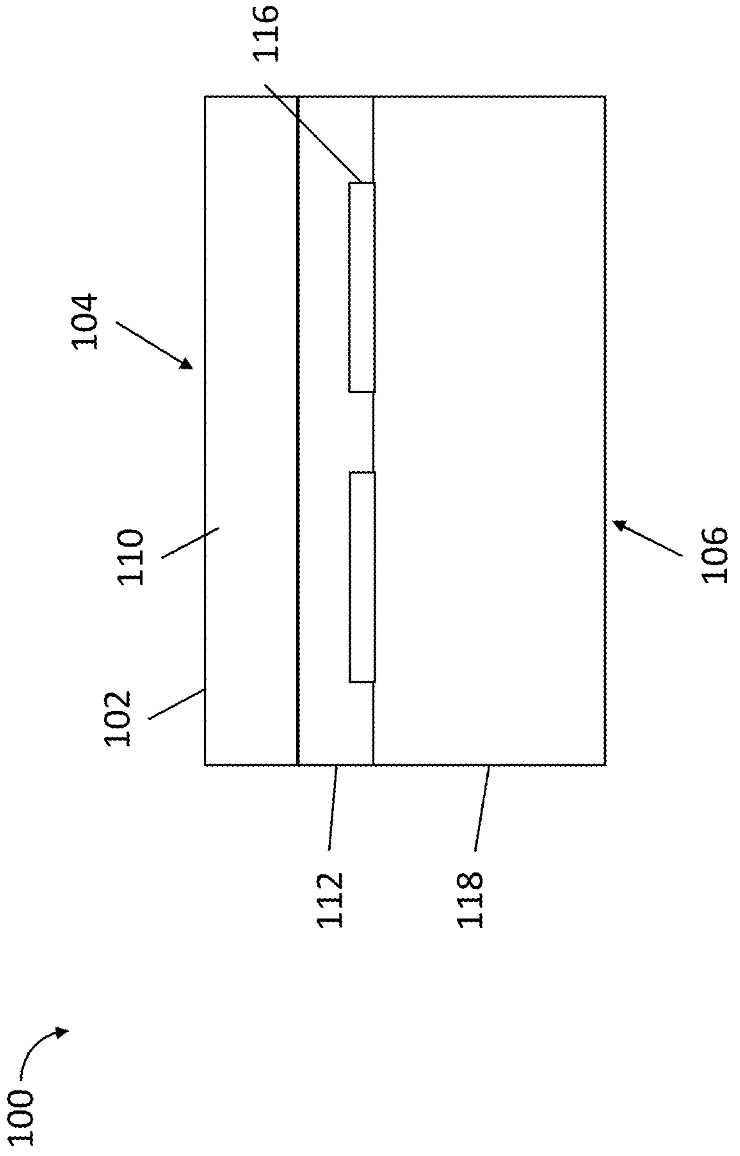
FIG. 3 is a sectional view of another non-limiting example embodiment of the device.

FIG. 3 is a sectional view of another non-limiting example embodiment of the device 100. According to some embodiments, device 100 is an electrostatic chuck. As shown in FIG. 3, in some embodiments, the device 100 and body 102 comprises a dielectric layer 110, a bonding layer 112, an electrode layer 116, and an isolator layer 118. The bonding layer 112 is located between the dielectric layer 110 and the electrode layer 116, and the electrode layer 116 is located between the bonding layer 112 and the isolator layer 118 so that electrode layer 116 does not directly contact the dielectric layer 110.

The dielectric layer 110 is disposed at side 104 and defines a top surface of the device 100. Opposite this top surface, the dielectric layer 110 contacts bonding layer 112. In some embodiments, the dielectric layer 110 directly contacts bonding layer 112. The dielectric layer 110 can be a continuous layer of dielectric material disposed on a surface of the device 110 at side 104.

The dielectric layer 110 may be formed of a suitable dielectric material such as, for example, a ceramic material. The ceramic material used to form the dielectric layer 110 can include a dielectric material that has a higher dielectric resistivity compared to a dielectric resistivity of the isolator layer 118. Due to the bonding layer 112 located between the electrode layer 116 and the dielectric layer 110, a thickness of each of the dielectric layer 110 and bonding layer 112 may be precisely controlled to allow the device 100 to operate in a desired voltage range. However, it is to be appreciated by those having ordinary skill in the art that the thickness of the dielectric layer 110 may be negated in electrostatic chuck designs which do not require a critically defined clamp force or have a thick dielectric ceramic layer (>300 μm), as then the added thickness of the intervening layers may have a negligible effect on clamp force.

In some embodiments, the dielectric layer 110 may have a thickness of 1 μm to 300 μm, or any range or subrange therebetween. For example, in some embodiments, the dielectric layer 110 may have a thickness of 100 μm to 250 μm. In another example, in some embodiments, the dielectric layer 110 may have a thickness of 150 μm to 250 μm.

The bonding layer 112 is disposed between dielectric layer 110 and electrode layer 116. The bonding layer 112 contacts the electrode layer 116 and the dielectric layer 110 to bond the dielectric layer 110 to the device 100. Additionally, the bonding layer 112 can also function as a charge barrier layer. In some embodiments, the bonding layer 112 directly contacts electrode layer 116. The bonding layer 112 can be a continuous layer of material to smooth a surface roughness of the electrode layer 116 to reduce the likelihood of charge injection from the electrode layer 116 into the dielectric layer 110. The bonding layer 112 separates the electrode layer 116 from the dielectric layer 110. In some embodiments, the bonding layer 112 covers the electrode layer 116 wherein a surface roughness of an upper surface of the bonding layer 112 is less than a surface roughness of an upper surface of the electrode layer 116.

The bonding layer 112 may comprise materials having desirable dielectric properties. In some embodiments, the bonding layer 112 includes a non-electrically conductive polymeric material. In some embodiments, the bonding layer 112 may comprise a polymeric material having a desirable dielectric strength and that melts and becomes pliable or moldable above a specific temperature to cover a surface of the electrode layer 116 and solidifies upon cooling to form a layer between the electrode layer 116 and the dielectric layer 110. In some embodiments, the bonding layer 112 includes at least one of a fluorinated ethylene propylene, a perfluoroalkoxy alkane, a polytetrafluoroethylene, or any combination thereof.

As the bonding layer 112 is disposed between the electrode layer 116 and the dielectric layer 110 and is non-electrically conductive, a thickness of the bonding layer 112 may also be precisely controlled to allow the device 100 to operate in a desired voltage range when electric current is applied to the electrode layer 116 to generate the desired clamping force. In this regard, the bonding layer 112 may have a thickness of 1 μm to 1000 μm, or any range or subrange therebetween. For example, in some embodiments, the bonding layer 112 has a thickness of 50 μm to 200 μm.

The electrode layer 116 is disposed between the bonding layer 112 and isolator layer 118. The electrode layer 116 contacts the isolator layer 118. In some embodiments, the electrode layer 116 directly contacts the isolator layer 118. The electrode layer 116 comprises an electrically conductive filament or wire that may be deposited onto the isolator layer 118. When using the device 100, an electric current may be directed through the filaments or wires of electrode layer 116 to generate an electromagnetic field capable of providing the clamping force to the device 100 to allow the semiconductor wafer to be clamped onto a surface of the dielectric layer 110 at side 104 during use of the device 100.

According to various embodiments, the dielectric layer 110 is bonded to the isolator layer 118 to provide the dielectric layer 110 with structural support. The dielectric layer 110 can be bonded to the isolator layer via one or more intervening layers (e.g. layers 112 and 116 and, in some cases, a charge barrier layer). The isolator layer 118 can comprise a ceramic material. The ceramic material used to form the isolator layer 118 can include material that has a lower dielectric resistivity compared to a dielectric resistivity of the dielectric layer 110.

EXAMPLE

The force required to remove a silicon wafer from a control electrostatic chuck (Control) is compared to the force required to remove a silicon wafer from three sample electrostatic chucks (Sample A, Sample B, and Sample C). A reduction in the force required to remove the silicon wafer from the Sample would confirm a reduction in charge injection.

The Control is constructed such that the dielectric layer directly contacts the electrode layer.

Sample A is constructed such that the charge barrier layer is located between the dielectric layer and the electrode layer, and the bonding layer is located between the charge barrier layer and the electrode layer. The dielectric layer directly contacts the charge barrier layer. The charge barrier layer directly contacts the bonding layer. The bonding layer directly contacts the electrode layer.

Sample B is constructed such that the charge barrier layer is located between the dielectric layer and the electrode layer. The dielectric layer directly contacts the charge barrier layer. The charge barrier layer directly contacts the electrode layer.

Sample C is constructed such that the bonding layer is located between the dielectric layer and the electrode layer. The dielectric layer directly contacts the bonding layer. The bonding layer directly contacts the electrode layer.

A standard procedure for testing the electrostatic chucks includes clamping a silicon wafer to an electrostatic chuck. Subsequently powering off the electrostatic chuck. The force required to remove the silicon wafer from the electrostatic chuck, when the power is off, is measured. As shown in the table below, it is confirmed that each of Sample A, Sample B, and Sample C required less force to remove the silicon wafer from the electrostatic chuck when the power is off, relative to the control.

| | Less Force Required to Remove Silicon Wafer, Relative to Control? |
|---|---|
| Sample A | Yes |
| Sample B | Yes |
| Sample C | Yes |

Aspects

Aspect 1. An electrostatic chuck comprising:
- a dielectric layer;
- a bonding layer;
- a charge barrier layer;
- an electrode layer; and
- an isolator layer;
  - wherein the bonding layer is located between the dielectric layer and the charge barrier layer;
  - wherein the charge barrier layer is located between the bonding layer and the electrode layer;
  - wherein the electrode layer is located between the charge barrier layer and the isolator layer so that electrode layer does not directly contact the dielectric layer.

Aspect 2. The electrostatic chuck according to Aspect 1, wherein the dielectric layer directly contacts the bonding layer.

Aspect 3. The electrostatic chuck according to any one of Aspects 1-2, wherein the bonding layer directly contacts the charge barrier layer.

Aspect 4. The electrostatic chuck according to any one of Aspects 1-3, wherein the charge barrier layer directly contacts the electrode layer.

Aspect 5. The electrostatic chuck according to any one of Aspects 1-4, wherein the electrode layer directly contacts the isolator layer.

Aspect 6. The electrostatic chuck according to any one of Aspects 1-5, wherein the bonding layer comprises a non-electrically conductive polymeric material.

Aspect 7. The electrostatic chuck according to any one of Aspects 1-6, wherein the bonding layer comprises at least one of a fluorinated ethylene propylene, a perfluoroalkoxy alkane, a polytetrafluoroethylene, or any combination thereof.

Aspect 8. The electrostatic chuck according to any one of Aspects 1-7, wherein the bonding layer covers the electrode layer such that a surface roughness of an upper surface of the bonding layer is less than a surface roughness of an upper surface of the electrode layer.

Aspect 9. The electrostatic chuck according to any one of Aspects 1-8, wherein the charge barrier layer is a continuous layer of a non-electrically conductive material.

Aspect 10. The electrostatic chuck according to any one of Aspects 1-9, wherein the charge barrier layer comprises a metal oxide deposited by atomic layer deposition.

Aspect 11. The electrostatic chuck according to any one of Aspects 1-10, wherein the dielectric layer has a thickness of 25 μm to 500 μm.

Aspect 12. The electrostatic chuck according to any one of Aspects 1-11, wherein the bonding layer has a thickness of 10 μm to 200 μm.

Aspect 13. The electrostatic chuck according to any one of Aspects 1-12, wherein the charge barrier layer has a thickness of 100 nm to 1 μm.

Aspect 14. An electrostatic chuck comprising:
- a dielectric layer;
- a bonding layer;
- an electrode layer; and
- an isolator layer;
- wherein the bonding layer is located between the dielectric layer and the electrode layer;
- wherein the electrode layer is located between the bonding layer and the isolator layer;
- wherein the electrode layer does not directly contact the dielectric layer.

Aspect 15. The electrostatic chuck according to Aspect 14, wherein the dielectric layer directly contacts the bonding layer.

Aspect 16. The electrostatic chuck according to any one of Aspects 14-15, wherein the bonding layer directly contacts the electrode layer.

Aspect 17. The electrostatic chuck according to any one of Aspects 14-16, wherein the electrode layer directly contacts the isolator layer.

Aspect 18. The electrostatic chuck according to any one of Aspects 14-17, wherein the bonding layer comprises a non-electrically conductive polymeric material.

Aspect 19. The electrostatic chuck according to any one of Aspects 14-18, wherein the bonding layer comprises at least one of a fluorinated ethylene propylene, a perfluoroalkoxy alkane, a polytetrafluoroethylene, or any combination thereof.

Aspect 20. The electrostatic chuck according to any one of Aspects 14-19, wherein the bonding layer covers the electrode layer such that a surface roughness of an upper surface of the bonding layer is less than a surface roughness of an upper surface of the electrode layer.

What is claimed is:

1. An electrostatic chuck comprising:

a dielectric layer;

a bonding layer;

a charge barrier layer;

an electrode layer; and an isolator layer;

wherein the bonding layer is located between the dielectric layer and the charge barrier layer;

wherein the charge barrier layer is located between the bonding layer and the electrode layer and is a continuous layer of a non-electrically conductive material;

wherein the electrode layer is located between the charge barrier layer and the isolator layer so that electrode layer does not directly contact the dielectric layer.

2. The electrostatic chuck of claim 1, wherein the dielectric layer directly contacts the bonding layer.

3. The electrostatic chuck of claim 1, wherein the bonding layer directly contacts the charge barrier layer.

4. The electrostatic chuck of claim 1, wherein the charge barrier layer directly contacts the electrode layer.

5. The electrostatic chuck of claim 1, wherein the electrode layer directly contacts the isolator layer.

6. The electrostatic chuck of claim 1, wherein the bonding layer comprises a non-electrically conductive polymeric material.

7. The electrostatic chuck of claim 1, wherein the bonding layer comprises at least one of a fluorinated ethylene propylene, a perfluoroalkoxy alkane, a polytetrafluoroethylene, or any combination thereof.

8. The electrostatic chuck of claim 1, wherein the bonding layer covers the electrode layer such that a surface roughness of an upper surface of the bonding layer is less than a surface roughness of an upper surface of the electrode layer.

9. The electrostatic chuck of claim 1, wherein the charge barrier layer comprises a metal oxide deposited by atomic layer deposition.

10. The electrostatic chuck of claim 1, wherein the dielectric layer has a thickness of 25 μm to 500 μm.

11. The electrostatic chuck of claim 1, wherein the bonding layer has a thickness of 10 μm to 200 μm.

12. The electrostatic chuck of claim 1, wherein the charge barrier layer has a thickness of 100 nm to 1 μm.

13. An electrostatic chuck comprising:

a dielectric layer;

a bonding layer;

an electrode layer; and an isolator layer;

wherein the bonding layer is located between the dielectric layer and the electrode layer and directly contacts the electrode layer, wherein the electrode layer is located between the bonding layer and the isolator layer, wherein the electrode layer does not directly contact the dielectric layer, wherein the bonding layer covers the electrode layer such that a surface roughness of an upper surface of the bonding layer is less than a surface roughness of an upper surface of the electrode layer.

14. The electrostatic chuck of claim 13, wherein the dielectric layer directly contacts the bonding layer.

15. The electrostatic chuck of claim 13, wherein the electrode layer directly contacts the isolator layer.

16. The electrostatic chuck of claim 13, wherein the bonding layer comprises a non-electrically conductive polymeric material.

17. The electrostatic chuck of claim 13, wherein the bonding layer comprises at least one of a fluorinated ethylene propylene, a perfluoroalkoxy alkane, a polytetrafluoroethylene, or any combination thereof.

* * * * *